(12) United States Patent
Nambu

(10) Patent No.: US 10,879,407 B2
(45) Date of Patent: Dec. 29, 2020

(54) OPTICAL SENSOR AND METHOD FOR FORMING SAME

(71) Applicant: NEC Corporation, Tokyo (JP)

(72) Inventor: Yoshihiro Nambu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/336,740

(22) PCT Filed: Sep. 20, 2017

(86) PCT No.: PCT/JP2017/033817
§ 371 (c)(1),
(2) Date: Mar. 26, 2019

(87) PCT Pub. No.: WO2018/061898
PCT Pub. Date: Apr. 5, 2018

(65) Prior Publication Data
US 2019/0229221 A1 Jul. 25, 2019

(30) Foreign Application Priority Data
Sep. 27, 2016 (JP) .................................. 2016-188123

(51) Int. Cl.
*H01L 31/0236* (2006.01)
*H01L 31/0232* (2014.01)
(Continued)

(52) U.S. Cl.
CPC .. *H01L 31/02366* (2013.01); *H01L 31/02327* (2013.01); *H01L 31/022408* (2013.01);
(Continued)

(58) Field of Classification Search
CPC ......... H01L 31/02366; H01L 31/02327; H01L 31/02363
See application file for complete search history.

(56) References Cited

U.S. PATENT DOCUMENTS 6,100,987 A * 8/2000 Kawakubo ............ G03F 9/7088
356/401
2009/0261353 A1 10/2009 Gaebler et al.
(Continued)

FOREIGN PATENT DOCUMENTS

| JP | 06-244444 A | 9/1994 |
| JP | 08-242015 A | 9/1996 |

(Continued)

OTHER PUBLICATIONS

Eli Yablonovitch, "Statistical ray optics", J. Opt. Soc. Am., Jul. 1982, pp. 899-907, vol. 72, No. 7.
(Continued)

*Primary Examiner* — Jay C Chang
*Assistant Examiner* — Mikka Liu
(74) *Attorney, Agent, or Firm* — Sughrue Mion, PLLC

(57) ABSTRACT

In order to provide an optical sensor that is capable of obtaining both an optical trap effect and a moth eye effect with a single texture structure, a semiconductor optical sensor according to the present invention includes a light absorption medium that has a refractive index n and a thickness sufficiently less than a light transmission length, wherein the center wavelength to be observed is defined as $\lambda$. The semiconductor optical sensor is characterized by: having, in a light incident surface, a texture structure having a random surface direction and a typical structure scale d defined as in ($\lambda/n$).

9 Claims, 5 Drawing Sheets

(51) Int. Cl.
    *H01L 31/18* (2006.01)
    *H01L 31/0352* (2006.01)
    *H01L 31/0224* (2006.01)
    *H01L 31/10* (2006.01)

(52) U.S. Cl.
    CPC ...... *H01L 31/035218* (2013.01); *H01L 31/10* (2013.01); *H01L 31/184* (2013.01)

(56) References Cited

U.S. PATENT DOCUMENTS

| | | | | |
|---|---|---|---|---|
| 2012/0061785 | A1* | 3/2012 | Ishikawa | H01L 31/0232 257/431 |
| 2017/0110493 | A1* | 4/2017 | Yokogawa | H01L 27/146 |

FOREIGN PATENT DOCUMENTS

| | | |
|---|---|---|
| JP | 11-251611 A | 9/1999 |
| JP | 2005-347402 A | 12/2005 |
| JP | 2013-179217 A | 9/2013 |
| JP | 2015-018906 A | 1/2015 |
| JP | 2015-220313 A | 12/2015 |
| JP | 2016-001633 A | 1/2016 |
| JP | 2016-009846 A | 1/2016 |
| WO | 2010/140621 A1 | 12/2010 |

OTHER PUBLICATIONS

Eli Yablonovitch et al., "Intensity Enhancement in Textured Optical Sheets for Solar Cells", IEEE Transactions on Electron Devices, Feb. 1982, pp. 300-305, vol. ED-29, No. 2.

S.J. Wilson et al., "The Optical Properties of 'Moth Eye' Antireflection Surfaces", Optica Acta, 1982, pp. 993-1009, vol. 29, No. 7.

Yan Liu et al., "Hybridizing ZnO Nanowires with Micropyramid Silicon Wafers as Superhydrophobic High-Efficiency Solar Cells", Adv. Energy Mater., 2012, pp. 47-51, vol. 2.

Federico Lora Gonzalez et al., "Enhancing near-infrared light absorption in PtSi thin films for Schottky barrier IR detectors using moth-eye surface structures", Optics Letters, Apr. 1, 2015, pp. 1512-1515, vol. 40, No. 7.

D'Souza, A. I. et al., "InAsSb detectors for visible to MWIR high-operating temperature applications", In Infrared Technology and Applications XXXVII, edited by Bjorn F. Andresen; Gabor F. Fulop; Paul R. Norton, Orlando, Florida, Usa, Apr. 25, 2011, Proc. Of SPIE, pp. 80122S-1-80122S-8, vol. 8012.

International Search Report of PCT/JP2017/033817 dated Dec. 19, 2017 [PCT/ISA/210].

Written Opinion of PCT/JP2017/033817 dated Dec. 19, 2017 [PCT/ISA/237].

* cited by examiner

OPTICAL SENSOR AND METHOD FOR FORMING SAME

CROSS REFERENCE TO RELATED APPLICATIONS

This application is a National Stage of International Application No. PCT/JP2017/033817, filed Sep. 20, 2017, claiming priority to Japanese Patent Application No. 2016-188123, filed Sep. 27, 2016, the contents of all of which are incorporated herein by reference in their entirety.

TECHNICAL FIELD

The present invention relates to an optical sensor, in particular to an optical sensor aiming to acquire information on a target by receiving light and a method for forming the same.

BACKGROUND ART

Photoelectric conversion elements have been used for a plurality of purposes. Important examples include a solar cell aiming to collect useful energy from sunlight and an optical sensor aiming to acquire useful information related to a target from observation light, such as a sensing device used for IoT (Internet of Things).

An important performance specification of these photoelectric conversion elements is a photoelectric conversion efficiency. For example, a solar cell is required to convert all light energy in a wavelength region having a high spectrum intensity of solar light from ultraviolet to near-infrared to as large electric energy as possible. Situations in an optical sensor are similar but somewhat different for an optical sensor that detects light in a specific wavelength region for the purpose of acquiring information and that is required to increase an optical signal-to-noise ratio determined by a difference from a background noise component as an electric output acquired when light is not irradiated.

For a solar cell, inexpensive silicon is used as a light absorption medium. For an optical sensor, a light absorption medium associated with a target optical wavelength is used and a III-V or a II-VI compound semiconductor is often used. A light absorption probability of these light absorption media is determined by a light absorption coefficient $\alpha$ of a substance and is given, for a medium having a uniform thickness L, by:

$$1-\exp^{-\alpha L}=1-\exp^{-L/L_{OP}}$$

Accordingly, this value becomes as close as possible to 1 by increasing a thickness L of a medium. In this respect, $L_{op}=\alpha^{-1}$ is called a penetration thickness of a medium and $L/L_{op}$ is called an optical thickness. A medium where $L/L_{op}>1$ ($L/L_{op}<1$) is called optically thick (optically thin).

However, an actual optical device cannot increase the thickness L without limitation. For example, a solar cell has an issue of a high manufacturing cost of a silicon crystal with a large L and a high purity, and therefore it is required to increase a light absorption probability with as thin a silicon crystal as possible. For an optical sensor, a background noise component increases substantially in proportion to a thickness L and an extraction efficiency of a photocurrent decreases in inverse proportion to L. Thus, performance may be degraded by increasing a film thickness of a silicon crystal.

Under these circumstances, a photoelectric conversion device may often be developed starting with development of a thick film absorption layer device, followed by thinning of the absorption layer. For a solar cell, reduction in a manufacturing cost is a great motivation of thinning of a silicon crystal being an absorption medium, while, for an optical sensor, improvement of a signal-to-noise ratio, a time responsiveness and the like motivate development of a thin film semiconductor optical sensor.

There is, however, an issue that thinning of an absorption medium directly translates to a decrease in a light absorption efficiency. In order to address this issue, a variety of technologies have been developed.

For example, silicon can become optically very thin in a region of a longer wavelength than 1 μm being a band gap of silicon. Non Patent Literature 1 (NPL1) and Non Patent Literature 2 (NPL2) describe a texturing technology on a front or rear surface of silicon as a technology to solve an issue of degradation in a light absorption efficiency of a thin-film solar cell in a long wavelength band. An essential point of this technology is to enhance a probability of light being totally reflected at an internal interface of a medium thus enhancing a probability of light being trapped inside a semiconductor, by randomizing a direction of internal reflection of light at a semiconductor interface having a high refractive index. When an optical trap occurs effectively, a probability that light passes through an absorption medium a plurality of times increases, and thus a light absorption probability increases. Patent Literature 4 (PTL4) describes a photoelectric conversion element (solar cell) that suppresses reflection of light with a texture structure. In this example, a base side of a projecting part constituting a texture structure arranged in a light receiving surface of crystalline silicon has a length L of 700 nm≤L≤2 μm, and the projection part has a height h of $\{1.41\times(L/2)\}<h<\{4.23\times(L/2)\}$. PTL4 asserts that a photoelectric conversion element designed to suppress reflection of light in wavelength bands from a long wavelength band to a short wavelength band is obtained by setting L and h in this way.

As a separate technology that is similar to texturing, Non Patent Literature 3 (NPL3) proposes antireflection of light in a short wavelength band at a light incident surface by a moth eye effect. An essential point of this technology is to provide an interface with a function as a graded index interface at which a refractive index gradually changes, by arranging, in a surface, a texture structure having a finer pitch than an incident light wavelength, thereby attaining antireflection of light by an index matching effect.

When it is possible to strike a balance between enhancement of multipass absorption by an optical trap effect and antireflection of light at an incident surface by a moth eye effect, it seems that a solar cell having an improved photoelectric conversion performance can be provided. However, as described later, a structure scale of a texture surface offering these effects is substantially different, and thus there is an issue that it is difficult to enhance absorption of incident light into a solar cell in a wide wavelength region by using a single texture structure.

Non Patent Literature 4 (NPL4) and Patent Literature 1 (PTL1) each disclose a technology to obtain an optical trap effect and a moth eye effect at the same time by forming, in a surface, a complicated double hierarchical hybrid texture structure, thereby providing a silicon solar cell having a high photoelectric conversion efficiency for light in a wide wavelength region from near-infrared to ultraviolet by way of enhancing light absorption. In NPL4, concave and convex of a pyramidal shape are arranged in a silicon surface and a nano-wire of ZnO is formed on the surface of the concave and convex. Further, PTL1 discloses a solar cell including a first transparent conductive layer having a texture structure and a second transparent conductive layer having a moth eye structure formed thereon.

On the other hand, for an optical sensor, as disclosed in Non Patent Literature 5 (NPL5), Non Patent Literature 6 (NPL6). Patent Literature 2 (PTL2), and Patent Literature 3 (PTL3), there are examples of incident surface texturing considering a moth eye effect. NPL5 includes a moth eye structure of a truncated cone shape in an Si surface. In NPL6, an InAsSb absorber of a pyramidal shape is formed on a GaSb substrate. PTL2 describes a solid-state imaging device including an antireflective structure arranged in a light incident surface, which forms a plurality of types of projecting parts with different heights. In PTL3, a microscopic concave and convex structure (moth eye structure) is formed in a light incident surface of a semiconductor substrate in order to suppress reflection of incident light, at a light incident surface of a solid-state imaging device.

CITATION LIST

Patent Literature

[PTL1] Japanese Patent Application Laid-Open No. 2013-179217 (SOLAR CELL AND MANUFACTURING METHOD FOR THE SAME)
[PTL2] Japanese Patent Application Laid-Open No. 2015-18906 (IMAGING ELEMENT, MANUFACTURING APPARATUS, MANUFACTURING METHOD, ELECTRONIC APPARATUS)
[PTL3] Japanese Patent Application Laid-Open No. 2015-220313 (SOLID-STATE IMAGE PICKUP DEVICE AND ITS MANUFACTURING METHOD, AND ELECTRONIC APPARATUS)
[PTL4] Japanese Patent Application Laid-Open No. 2016-009846 (PHOTOELECTRIC CONVERSION ELEMENT AND PHOTOELECTRIC CONVERSION SYSTEM)
[PTL5] Japanese Patent Application Laid-Open No. 2005-347402
[PTL6] Japanese Patent Application Laid-Open No. H11-251611

Non Patent Literature

[NPL1] Eli Yablonovitch, "Statistical ray optics," J. Opt. Soc. Am. Vol. 72, No. 7, July 1982, pp. 899-907.
[NPL2] Eli Yablonovitch and George D. Cody, "Intensity Enhancement in Textured Optical Sheets for Solar Cells," IEEE TRANSACTIONS ON ELECTRON DEVICES, VOL. ED-29, NO. 2, February 1982, pp. 300-305.
[NPL3] S. J. Wilson & M. C. Hutley, "The Optical Properties of 'Moth Eye' Antireflection Surfaces," OPTICA ACTA, VOL. 29, NO. 7, 1982, pp. 993-1009.
[NPL4] Yan Liu, Arnab Das, Sheng Xu, Ziyin Lin, Chen Xu, Zhong Lin Wang, Ajeet Rohatgi, and Ching Ping Wong, "Hybridizing ZnO Nanowires with Micropyramid Silicon Wafers as Superhydrophobic High-Efficiency Solar Cells." Adv. Energy Mater. 2, 2012, pp. 47-51.
[NPL5] Federico Lora Gonzalez and Michael J. Gordon. "Enhancing near-infrared light absorption in PtSi thin films for Schottky barrier IR detectors using moth-eye surface structures," OPTICS LETTERS. Vol. 40, No. 7, Apr. 1, 2015, pp. 1512-1515.
[NPL6] D'Souza, A. I., A. C. Ionescu. M. Salcido, E. Robinson, L. C. Dawson, D. L. Okerlund, T. J. de Lyon, R. D. Rajavel, H. Sharifi, D. Yap, M. L. Beliciu, S. Mehta, W. Dai, G. Chen, N. Dhar and P. Wijewarnasuriya. "InAsSb detectors for visible to MWIR high operating temperature applications", In Infrared Technology and Applications XXXVII, edited by Bjorn F. Andresen; Gabor F. Fulop; Paul R. Norton, Orlando, Fla., USA, Apr. 25, 2011. 80122S. (SPIE Proceedings; vol. 8012).

SUMMARY OF INVENTION

Technical Problem

Since a light absorption wavelength can be flexibly controlled by structure control, and a background noise may be suppressed and a response performance may be enhanced by minimizing a volume of a light absorption medium, a desire to develop an optical sensor using a quantum well or a quantum dot as a light absorption medium has recently been growing. These new optical sensors use only a thin film absorption layer that is optically very thin, due to limitations in manufacturing. Thinning of a film is advantageous in terms of suppression of a background noise and improvement of a gain but is disadvantageous from the standpoint of light absorption. Thus, there is an issue that it is difficult to make full use of an advantage of a quantum well or a quantum dot optical sensor.

For these thin film semiconductor optical sensors, it may be useful to utilize texturing of an incident surface or a reflective surface expecting multipass light absorption by an optical trap effect, which is unnecessary in an optical sensor technology using an existing thick film light absorption layer, but there have been no examples of examination or product commercialization.

Further, it may be possible to provide an optical sensor having a higher photoelectric conversion performance by striking a balance between enhancement of multipass absorption by an optical trap effect and antireflection of light at an incident surface by a moth eye effect. However, in order to attain this goal, it is necessary to form a more complicated texture structure in a surface, which has left unavoidable such reliability-related issues as productivity issues including difficulty of manufacturing and an issue of an electrode contact characteristic.

An object of the present invention is to provide an optical sensor capable of solving the aforementioned issues in an optical sensor and acquiring a high photoelectric conversion efficiency by using a simple texture structure, and a method for forming the same.

Solution to Problem

A semiconductor optical sensor according to the present invention comprises a light absorption medium that has a refractive index n and a thickness sufficiently less than a light transmission length, wherein an observation target center wavelength is defined as $\lambda$, and the semiconductor optical sensor further comprises: in a light incident surface, a texture structure having a random surface direction and a typical structure scale d defined as in $(\lambda/n)<d<\lambda$; and a light reflector on a surface on an opposite side of the light incident surface.

In addition, a optical sensor according to the present invention comprises a light absorption medium that has a refractive index n and a thickness sufficiently less than a light transmission length, wherein an observation target center wavelength is defined as $\lambda$, and the optical sensor further comprises: in a light incident surface and a surface on an opposite side of the light incident surface, a texture structure having a random surface direction and a typical structure scale d defined as in (λ/n)<d<λ.

In addition, a method of forming an optical sensor according to the present invention, comprising: forming, on a substrate, a light absorption medium having a refractive index n and a thickness sufficiently less than a light transmission length; and forming, on the light absorption medium, an opening pattern having a random substrate surface direction, and thereby forming a first texture structure having a typical structure scale d defined as in (λ/n) <d<λ on the light absorption medium.

Advantageous Effects of Invention

According to the present invention, it is possible to provide an optical sensor capable of acquiring a high photoelectric conversion efficiency by using a simple texture structure, and a method for forming the same.

EXAMPLE EMBODIMENT

Example embodiments of the present invention will be described with reference to drawings.

First Example Embodiment

[Description of Structure]

Figure 1:
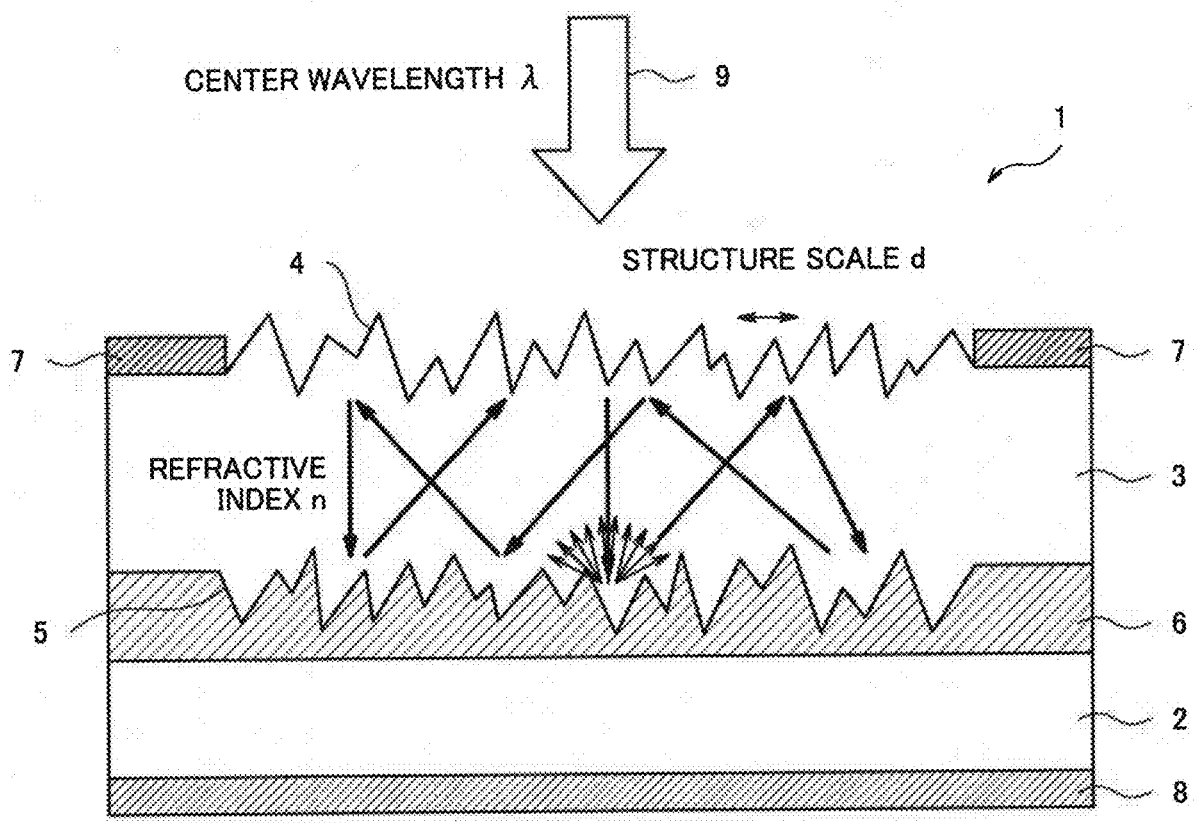
FIG. 1 is a sectional view schematically illustrating a thin film semiconductor optical sensor according to a first example embodiment of the present invention.

FIG. 1 is a sectional view schematically illustrating an optical sensor according to a first example embodiment of the present invention. An optical sensor 1 according to this example embodiment is laminated on a substrate 2 as illustrated in FIG. 1 and includes a light absorption medium 3 having a refractive index n and absorbing light of a target center wavelength λ. A thickness of the light absorption medium 3 is sufficiently less than a light transmission length (an inverse of an absorption coefficient). The substrate 2 and the light absorption medium 3 are properly doped. It is possible to pull out a photocarrier generated via light absorption by giving a proper bias to a lower electrode 8 arranged in a lower part of the substrate 2 and an upper electrode 7 arranged in an upper part of the light absorption medium 3. When the substrate 2 is made of GaAs, an n-type semiconductor substrate is formed for example by doping Si about 1 to $3\times10^{-18}$ cm$^{-3}$. As a rule, the light absorption medium 3 is not intentionally doped. A bias voltage applied across the upper electrode 7 and the lower electrode 8 depends on a device structure but is generally several volts.

In a surface of the light absorption medium 3 that receives incident light 9 having a center wavelength λ is implemented a light incident surface texture structure 4 having a typical structure scale d and in an opposite surface is implemented, in a similar way, a rear surface texture structure 5 having a typical structure scale d. In a lower part of the rear surface texture structure 5 is arranged, as appropriate, a light reflector 6 formed of a metal or the like.

In this example, the light incident surface texture structure 4 and the rear surface texture structure 5 each have concave and convex surface. Light transmission and reflection at an individual surface locally depend on the surface direction of the surface and follows the Snell's law. However, an orientation of the individual surface is random, so that the light incident surface texture structure 4 and the rear surface texture structure 5 serve as light-scattering surfaces at which light reflection occurs isotropically on a semispherical surface when viewed with respect to a large area from a general standpoint. The typical structure scale d is an average pitch (period) of a concave and convex structure and d>(λ/n) is required because light reflection at an individual surface of a texture structure needs to depend on a surface orientation. To evaluate whether d>(λ/n) is satisfied, d of an arbitrary sample region should be evaluated using one of a variety of surface roughness measuring devices. Note that a height of the light incident surface texture structure 4 and the rear surface texture structure 5 is in the order of the wavelength λ.

The light reflector 6 is arranged for the following purpose. When a texture structure is formed, light is intended to be totally reflected at an interface of the light absorption medium 3 and reflected back and forth a plurality of times inside the light absorption medium 3. A ray of light, however, is transmitted and deviated toward the substrate 2 without being totally reflected at a texture structure. The light reflector 6 operates to reflect the ray of light not totally reflected at a rear surface texture structure thus preventing the ray of light from being deviated toward the substrate 2 and to return the same to the light absorption medium 3 again.

[Description of Advantageous Effect]

A thin film semiconductor optical sensor according to the example embodiment strikes a balance between enhancement of multipass light absorption by an optical trap effect and antireflection of light at a semiconductor surface by a moth eye effect in a desired wavelength band by arranging a single texture structure in a light incident surface, thus delivering a potential performance thereof without causing an issue with reliability of productivity. How this scheme is made feasible will be detailed below with reference to drawings.

First, enhancement of multipass light absorption by an optical trap effect will be described. It has been known for a long time that, it is possible to efficiently trap light by taking advantage of total reflection inside an optically thin medium having a higher refractive index than the air as an external environment. As indicated by the Fresnel's formula, total reflection inside a medium occurs only for light incident at a large angle, or a shallow angle with respect to an interface. Light that has not been totally reflected is refracted at an internal interface and is transmitted and radiated in the air. An optical mode where light is incident from the air into a medium and an optical mode as a reverse process where light is radiated from a medium into the air are in one-to-one correspondence. Assuming that this phenomenon is called a transmission mode, the transmission mode is never coupled, at a flat interface, to a total reflection mode where total reflection occurs at an internal interface of a medium. Thus, when light is caused to be incident from the air into a thin film absorption medium having a flat interface, what occurs at most is a back-and-forth double pass light absorption.

To open a window of multipass light absorption, a means for coupling the transmission mode and the total reflection mode is necessary. Texturing of an interface is an effective coupling means and has been known for a long time as a means for enhancing multipass light absorption of light in a long wavelength band by a solar cell. When scattered reflection of light at a textured interface occurs isotropically on a semispherical surface, a probability that light totally reflected at a texture surface is not totally reflected at a next texture surface but is transmitted into the air drops to $1/n^2$. As a result, light is trapped in an optically sufficiently thin uniform medium having a refractive index n, and after total reflection at an interface $n^2$ times on the average, is emitted into the air. A pass length until the light is emitted into the air is multiplied by $n^2$ and a light intensity in a medium is enhanced by $n^2$ times thus improving an absorption efficiency of the medium. Absorption enhancement occurs by way of multipass light absorption, so that an optical trap does not occur in an optically thick medium where most of the light beams are absorbed in a single pass and it is not necessary to use an optical trap.

Absorption enhancement by an optical trap requires two conditions: (1) The medium has a high refractive index and is optically thin; and (2) Scattered reflection of light occurs isotropically on a semispherical surface at a textured interface in order to effectively couple the transmission mode and the total reflection mode. To satisfy the condition (2), the texture surface needs to have a structure where a surface direction is random and a structure scale of the texture surface needs to be greater than the order of the incident light wavelength because light reflection at an individual surface of the texture structure must depend on an individual surface orientation.

Next, surface antireflection by a moth eye effect will be described. At a texture surface having a structure that changes on a smaller scale than the order of the incident light wavelength, a moth eye effect is known that a vertical reflectivity from the air to a medium at a medium interface having a refractive index n ideally decreases from $((n-1)/(n+1))^2$ to, ideally, 0. This is because, due to a diffraction effect, operation on incident light does not depend on a surface orientation of an individual texture surface in a texture structure having a smaller structure scale than the order of the wavelength, but works as a kind of refractive index matching layer where an effective refractive index gradually changes from 1 to n. A moth eye effect functions as a refractive index matching layer to buffer a sudden change in an interface refractive index irrespective of an optical thickness of a medium, but never contributes to coupling of the transmission mode and the total reflection mode. As a reflectivity decreases, a light amount that reaches an absorption layer increases, which causes absorption enhancement. A moth eye effect is an effect well known as a reason an eye of a moth does not reflect light and this effect is utilized in an application such as anti-reflection at a surface of a liquid crystal device.

From the foregoing description, enhancement of multipass light absorption by an optical trap effect is important for an optically thin medium having a larger structure scale of a texture than a light wavelength, and an incident surface antireflection by a moth eye effect is important for a medium having a smaller structure scale, irrespective of an optical thickness of the medium. To put it another way, at a random texture surface having a single structure scale, an optical trap effect is important for light having a shorter wavelength than the structure scale, and a moth eye effect is important for light having a longer wavelength. These situations are obviously exclusive, and it has been thought that a single texture structure cannot obtain an optical trap effect and a moth eye effect at the same time for the purpose of absorption enhancement.

In particular, for a silicon solar cell, which aims to acquire energy, a photoelectric conversion efficiency of light needs to be enhanced for light in a wide wavelength region from near-infrared to ultraviolet. To enhance light absorption in a band having a longer wavelength than an optically thin band gap (up to 1 µm) by way of surface texturing, there is a need for a random texture surface having a larger structure scale than 1 µm where an optical trap effect is effective. To enhance light absorption in an optically thin ultraviolet region having a wavelength of 300 nm or less by way of surface antireflection, there is a need for a texture structure having a smaller scale that 300 nm where a moth eye effect is effective. Accordingly, it has been difficult to enhance absorption of incident light in a wide wavelength region by a silicon solar cell by using a single texture structure.

When a complicated double hierarchical texture structure is formed in a surface rather than a single texture structure, it is possible to provide a silicon solar cell capable of obtaining an optical trap effect and a moth eye effect at the same time and having a high photoelectric conversion efficiency for light in a wide wavelength region from near-infrared to ultraviolet by way of absorption enhancement. PTL1 and NPL4 describe that light absorption in a band having a longer wavelength than a band gap (up to 1 µm) is enhanced by way of an optical trap effect, by forming a texture surface having a larger structure scale larger 1 µm. PTL1 and NPL4 further propose arranging a double hierarchical hybrid texture structure for antireflection of light in an ultraviolet region by way of a moth eye effect by forming a texture structure having a scale of less than 300 nm on the texture surface. These approaches, however, leave issues with productivity and reliability.

On the other hand, an optical sensor, which aims to acquire information, may often be used to detect light in a specific narrow wavelength band, unlike a solar cell. In this case, it is possible to provide a thin film semiconductor optical sensor capable of obtaining an optical trap effect and a moth eye effect at the same time and having a high photoelectric conversion efficiency for light in a target wavelength band by way of absorption enhancement. Such an optical sensor will be described with reference to drawings.

Figure 2:
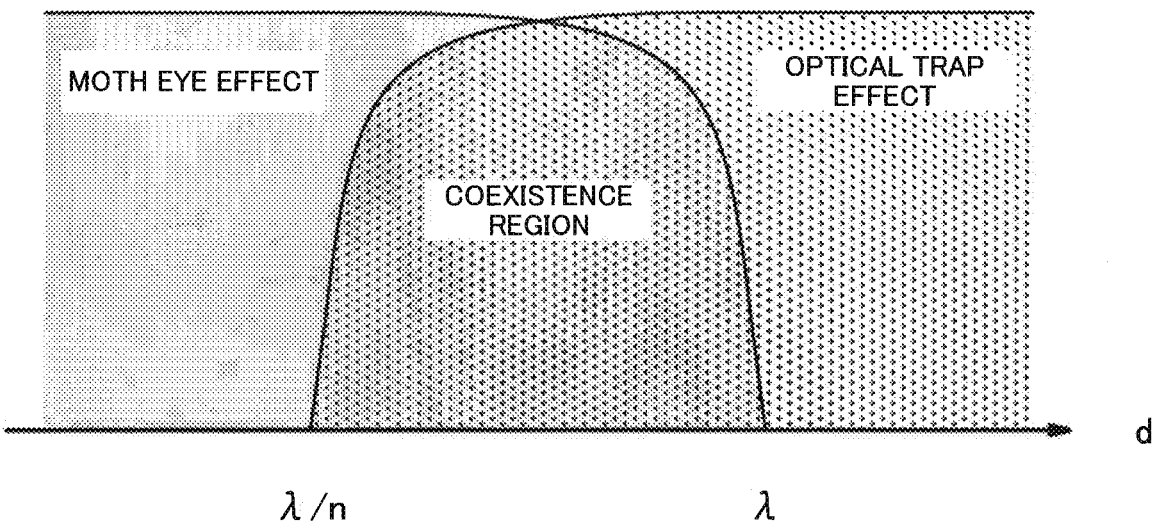
FIG. 2 is a first schematic diagram illustrating a principle of the first example embodiment of the present invention.

FIG. 2 is a first schematic diagram illustrating a principle of the optical sensor according to the example embodiment. A case will be examined where a texture surface having a random orientation is arranged in a light incident surface and a rear surface. FIG. 2 illustrates a relationship between an optical trap effect or a moth eye effect and an incident light wavelength. A horizontal axis d indicates a typical scale of a texture structure. Assuming that a detection target center wavelength of an optical sensor is $\lambda$, a corresponding effective optical wavelength inside a medium having a high refractive index (n>1) is $\lambda/n$ (<$\lambda$). Assuming that a typical structure scale of a random structure in a front surface a rear surface is d>$\lambda/n$, scattered reflection of light occurs when reflection at an interface inside a medium takes place, and thus an optical trap occurs in an optically thin absorption medium used for a thin film semiconductor optical sensor. On the other hand, assuming that d<$\lambda$ a moth eye effect occurs for incident light from outside a medium. When a structure scale of an incident texture surface of an optically thin medium is $\lambda/n<d<\lambda$, light that is incident having a target center wavelength $\lambda$ from the vertical directional vicinity is less reflected by a moth eye effect and propagates in an approximately perpendicular direction to a film in accordance with the Snell's law. The propagating light is scattered and reflected isotropically on a semispherical surface in a rear texture surface and propagates, and is once again scattered and reflected isotropically on a semispherical surface in a front texture surface. A probability that light is not totally reflected in a single scattered reflection but is transmitted outside a medium is $1/n^2$. Accordingly, observation light is trapped inside a medium, repeats total reflection an average of $n^2$ times at a texture surface, and is then emitted into the air.

Figure 3:
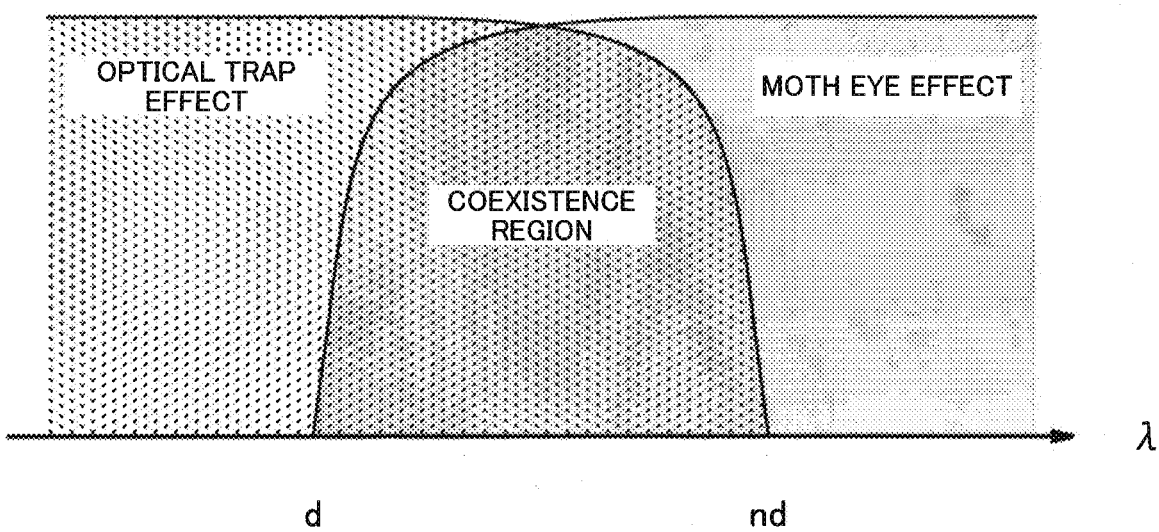
FIG. 3 is a second schematic diagram illustrating the principle of the first example embodiment of the present invention.

FIG. 3 is a second schematic diagram illustrating the principle of the optical sensor according to the example embodiment. FIG. 3 illustrates an effect observed when light having a target center wavelength $\lambda$ is incident on an absorption medium having a refractive index n which medium includes a texture structure having a typical structure scale d, with $\lambda$ as the horizontal axis. FIG. 3 illustrates that, for a light wavelength band where $d<\lambda<nd$, both reduction in an incident light reflectivity by a moth eye effect and multipass light absorption by an optical trap are obtained. For a semiconductor material, n is a value up to about 3.5 from an atom filling density of the material, and accordingly, a wavelength bandwidth where the two effects are compatible with each other is around $\Delta\lambda=(n-1)d$ to $2.5d$. When a center of the band $(n+1)d/2$ is matched with an observation target center wavelength $\lambda$ ($\lambda=(n+1)d/2$), $\Delta\lambda=2\lambda(n-1)/(n+1)$. This value translates to $\Delta\lambda$ of up to $1.11\lambda$, which is a value of the order of a center wavelength of detection target light, assuming that n=3.5. By using this principle in the detection of an infrared band of $\lambda>1$ μm, it is possible to provide a thin film semiconductor optical sensor that obtains an optical trap effect and a moth eye effect at the same time for detection target light in a practically sufficient band and that has a high photoelectric conversion efficiency via absorption enhancement based on the respective effects.

The optical sensor according to the example embodiment is a thin film semiconductor optical sensor that allows light in a target wavelength band to obtain an optical trap effect and a moth eye effect at the same time with a single texture structure by using the aforementioned principle and that has a high photoelectric conversion efficiency via absorption enhancement based on the respective effects. To this end, a texture structure having a random surface direction, that is, a concave and convex structure, is arranged in a light incident surface or a rear surface of a light absorption medium and a typical structure scale d of the texture structure is set to $(\lambda/n)<d<\lambda$, depending on the center wavelength $\lambda$ of target light. Further, a midpoint $(n+1)d/2$ of a structure scale d as viewed from outside of a medium and a structure scale nd as viewed from inside of the medium is matched with the center wavelength $\lambda$ of target detection light, that is, $\lambda=(n+1)d/2$. Assuming that $\lambda=1$ μm and n=3.5, $(\lambda/n)<d<\lambda$ translates to $0.28$ μm$<d<1$ μm. When $\lambda$ and d satisfy $\lambda=(n+1)d/2$, $d=0.44$ μm.

In PTL4, A base side of a projecting part constituting a texture structure arranged in a light receiving surface of crystalline silicon has a length L of 700 nm≤L≤2 μm. This is formally within a range of $0.28$ μm$<d<1$ μm, which falls within a range of 0.7 μm to 1 μm. However, the texture structure disclosed in PTL4 is, as understood from FIGS. 2 to 5 thereof, not random but includes projections of a square pyramidal shape arranged over the entire surface with a constant pitch. Moreover, crystalline silicon as a light absorption medium is thick. Thus, the aforementioned two conditions (1) and (2) for absorption enhancement by an optical trap do not hold. As a result, PTL4 does not have such an effect as in the example embodiment.

[Description of Manufacturing Method]

Figure 4:
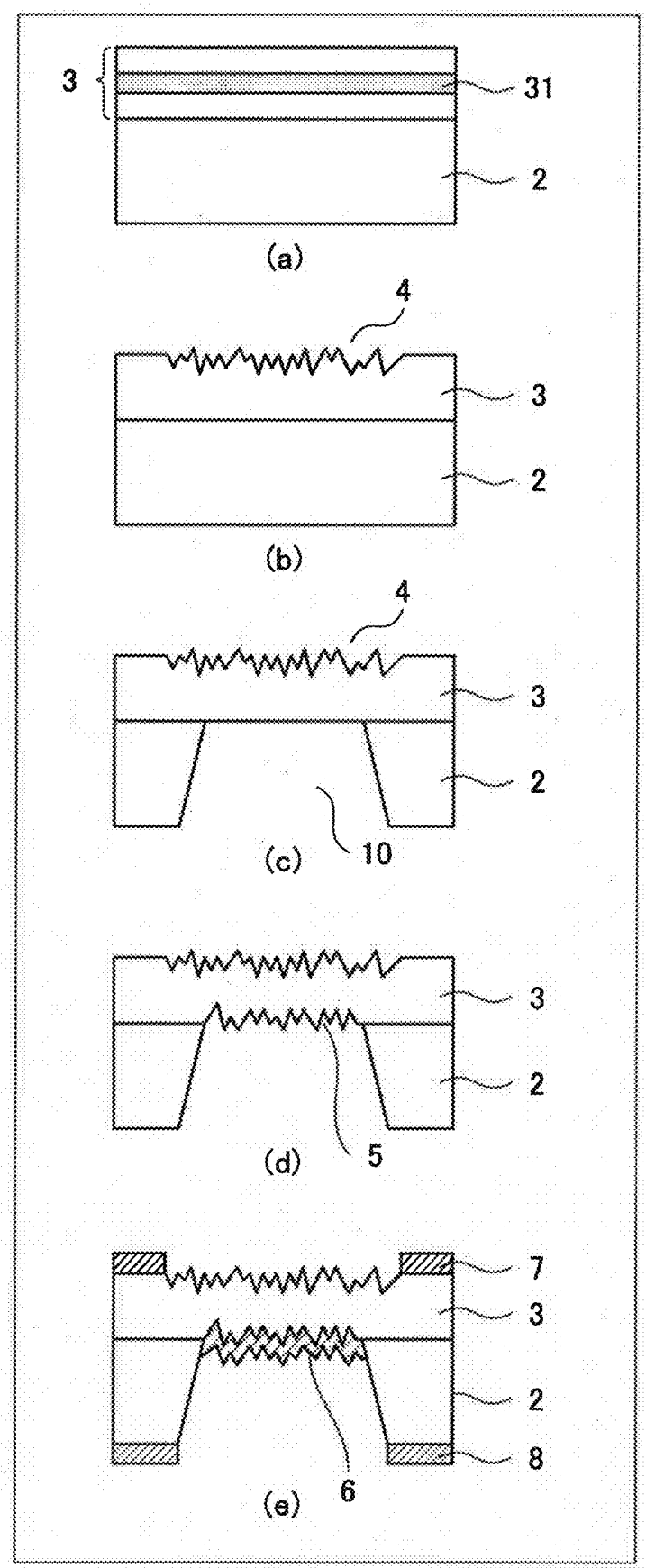
FIG. 4 is a process chart illustrating a method for manufacturing the thin film semiconductor optical sensor according to the first example embodiment of the present invention.

An example manufacturing process of the thin film semiconductor optical sensor according to the example embodiment will be described below with reference to drawings. (a) to (e) of FIG. 4 are process charts illustrating a manufacturing process of the thin film semiconductor optical sensor according to the example embodiment. An example manufacturing process described here is a case where an InAs quantum dot absorption layer 31 formed in a GaAs semiconductor layer is used as a light absorption medium 3. This manufacturing process is only an example of a major component of the thin film semiconductor optical sensor element and an actual thin film semiconductor optical sensor element may be changed depending on another device structure constitutive factor or the like, as long as the effect of the example embodiment is produced.

First, a GaAs substrate 2 is prepared and introduced into a growth apparatus. In this process, a molecular beam epitaxy device is used. Any other type of device, for example, an organic metal thermal decomposition film forming device, may be used as a growth apparatus as long as a thin film structure can be produced. A natural oxide film on a substrate surface is removed by ordinary purification processing of a substrate surface, such as increasing a substrate temperature to about 600° C. while irradiating As. Then, the light absorption medium 3 including the InAs quantum dot absorption layer 31 is grown. To be more specific, a GaAs layer is grown several micrometers by irradiating Ga at 580° C. in an As atmosphere and In is supplied in an amount corresponding to two or three molecular layers (MLs) at a substrate temperature of 480° C. thereby growing an InAs quantum dot layer.

InAs that has been supplied has a lattice constant difference of about 7.2% between GaAs and InAs and thus does not grow in a thin film shape but in a three-dimensional island shape, which is called Stranski Krastanov (SK) mode growth. The light absorption medium 3 including the InAs quantum dot absorption layer 31 is formed by implanting and growing this three-dimensional structure by using GaAs about 50 nm thick. In the actual growth procedure, this process is repeated 10 times and the quantum dot absorption layer 31 including 10 layers of InAs quantum dots is produced.

Further, a wafer for a thin film semiconductor optical sensor illustrated in (a) of FIG. 4 is obtained by growing GaAs again right away that is several micrometers thick as a final stage of the growth of the light absorption medium 3.

Next, the light incident surface texture structure 4 is formed in a surface where the GaAs light absorption medium 3 has grown (b) of FIG. 4). The light incident surface texture structure 4 of the light absorption film of the optical sensor according to the example embodiment is produced by forming a random structure mask pattern in a flat surface of the light absorption layer that has grown and using chemical etching by photolithography.

Figure 5:
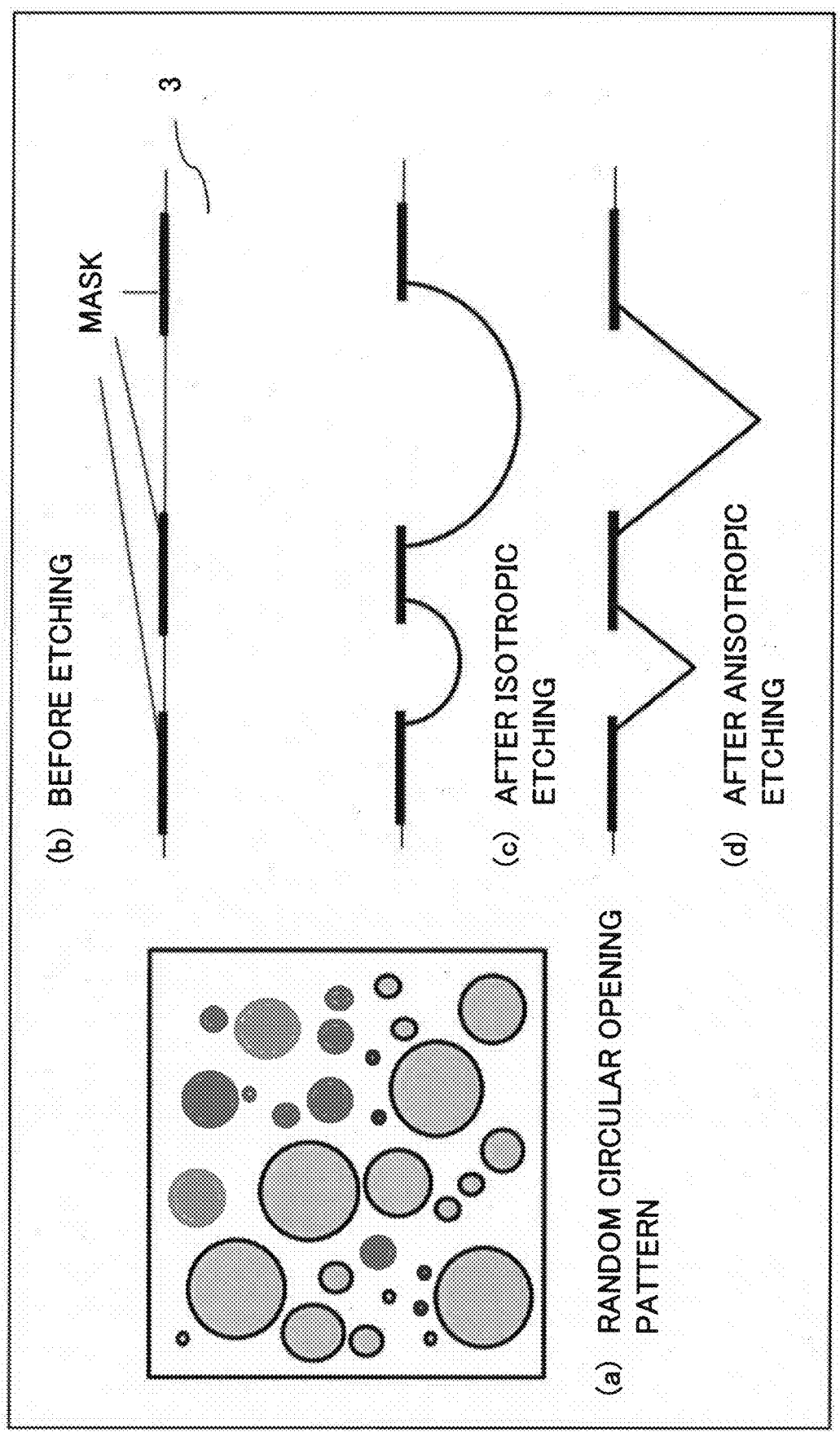
FIG. 5 illustrates an etching method in a manufacturing process of the thin film semiconductor optical sensor according to the first example embodiment of the present invention.

An etching method is illustrated in FIG. 5. For example, a random pattern mask such as one illustrated in the plan view in (a) of FIG. 5 is prepared. A grayed portion is a random opening. A sectional view of two representative openings (a large opening and a small opening) is illustrated in (b) of FIG. 5. The substrate 2 on which the light absorption medium 3 is formed is submerged in an etchant where isotropic etching progresses for an appropriate time. The "appropriate time" refers to a time in which patterns are determined by a magnitude, spacing or the like of a random pattern to be produced without patterns being integrated with each other. With this approach, a small hole is formed by etching a small opening and a large hole is formed by etching a large opening, thereby forming the random structure of a shape illustrated in the sectional view of (c) of FIG. 5. The example of (c) of FIG. 5 illustrates a case where an infiltrating speed into the substrate is greater than a speed of side etching under a mask (at an end). An isotropic etchant (for example, a solution in which a small amount of Br is dissolved in methanol) is used in this example. As an alternative, etching with an anisotropic etchant, for example, a mixed solution of aqueous ammonia and oxygenated water, by using a mask pattern that is a quadrangle-shaped or polygon-shaped random opening, forms the random structure including a hole of a reverse pyramidal shape illustrated in the sectional view of (d) of FIG. 5.

The thin film semiconductor optical sensor according to the example embodiment assumes an infrared sensor having a light receiving wavelength of several micrometers and thus has a large structure parameter and is within the scope of this method. When the wavelength is short or when a more microscopic structure is required, the electron beam exposure method, focused ion beam etching method, nano-imprint method or the like may be used.

As a simpler method, there is also a patterning method that uses another type of technique such as laser direct imaging when forming a mask pattern. Moreover, a technique is applicable that produces a random texture structure by implanting ion in the vicinity of a surface of the light absorption medium 3 and effectively varying a refractive index.

Next, as illustrated in (c) of FIG. 4, the GaAs semiconductor substrate 2 just below a light receiving surface of the thin film semiconductor optical sensor is partially removed. To be more specific, an opening slightly larger than the light receiving surface is produced in a rear surface of the GaAs semiconductor substrate 2 by using a photolithography technique, GaAs in the opening region is removed by way of chemical etching and an opening structure 10 is produced. GaAs is used as a substrate material in the example embodiment, and thus a mixed solution of aqueous ammonia and oxygenated water is used. While not described in the aforementioned manufacturing process, a thin AlGaAs layer about 10 nm thick is inserted between the substrate 2 and the light absorption medium 3 in an actual process. The mixed solution is characterized by etching GaAs but little etching AlGaAs, and accordingly, etching into the GaAs layer of the substrate 2 stops at the AlGaAs thin film layer. The AlGaAs thin film layer exposed at an opening can be easily removed by using dilute sulfuric acid without corroding the GaAs layer. As a result, the opening structure 10 illustrated in (c) of FIG. 4 can be produced.

Next, the rear surface texture structure 5 is formed in a surface of the light absorption medium 3 made of GaAs that is exposed at an opening. The rear surface texture structure 5 can be formed by using a similar technique to that used to form a light incident surface texture structure. In other words, any technique may be used, that is, the photolithography method, electron beam exposure method, focused ion beam etching method, nano-imprint method, laser direct imaging method or the like may be used. In the example embodiment, the structure illustrated in (d) of FIG. 4 is produced by forming a random pattern by using the laser direct imaging method and forming a concave and convex structure via chemical etching from the standpoint of process simplicity. In the chemical etching process, it is preferable to form a protective film (not illustrated) such as a resist on a texture structure in the light incident surface that has already been formed. A mask having the same random pattern need not be used for the light incident surface texture structure 4 and the rear surface texture structure 5 but any mask having a random pattern may be used. It is possible to use isotropic etching when forming the light incident surface texture structure 4 and use anisotropic etching when forming the rear surface texture structure 5.

In the last place, the upper electrode 7 and the lower electrode 8 of the thin film semiconductor optical sensor are produced. The upper electrode 7 is formed in a region other than the light incident surface texture structure 4 as illustrated in (e) of FIG. 4 by protecting the light incident surface texture structure 4 with a resist so as not to cause an electrode metal to be formed thereon, vacuum-depositing an electrode metal over the entire surface, and removing the resist by using the list-off method. The lower electrode 8 and the light reflector 6 are formed at once by depositing an electrode metal from a rear surface. In other words, a metal is deposited from a direction perpendicular to the rear surface of the substrate 2. This deposits a metal on the surface of the substrate 2 and the front surface of the rear surface texture structure 5 at once and the metal deposited on the rear surface of the substrate 2 functions as the lower electrode 8 and the metal deposited on the surface of the rear surface texture structure 5 functions as the light reflector 6. When these processes have ended, a wafer for the thin film semiconductor optical sensor is separated by element and a thin film semiconductor optical sensor element is completed.

Note that, in the manufacturing process, the rear surface texture structure 5 is produced in the exposed rear surface of the light absorption medium 3 after the opening structure 10 is formed. This is because, when the rear surface texture structure is arranged in a distant position from the light absorption medium 3, a ray of light propagating along a lamination surface among light beams totally reflected in a texture surface is more likely to be deviated from a PN coupling region and fail to contribute to a photocurrent. When it is possible to reduce a substrate thickness through sufficient polishing of the substrate 2 or arrange a light reflector on a side surface of a device, the rear surface texture structure 5 can be formed in the surface of the substrate 2 instead of the light absorption medium 3. The lower electrode 8 is produced by using a similar technique to that used for the upper electrode 7. This simplifies the manufacturing process.

A ray of light may repeat reflection between upper and lower random texture structures and, as a result, is deviated toward the side surface of the device. Arranging a light reflector on the side surface of the device reflects the ray of light and returns the same between the two random texture structures. Note that the light reflector may be formed only on a rear surface or a side surface, or both.

The aforementioned example embodiment uses InAs as a quantum dot material and GaAs as a material used to implant the quantum dot material. Other typical quantum dot materials/implant materials include InGaAs/GaAs, InAlAs/(Al) GaAs, InP/InGaP, InAs/InP, and the like. The example embodiment makes it possible to manufacture an absorption medium including a texture structure having a random surface orientation in its front and rear surfaces and to provide a thin film semiconductor optical sensor capable of delivering a potential performance thereof without causing an issue with reliability or productivity.

Second Example Embodiment

Figure 6:
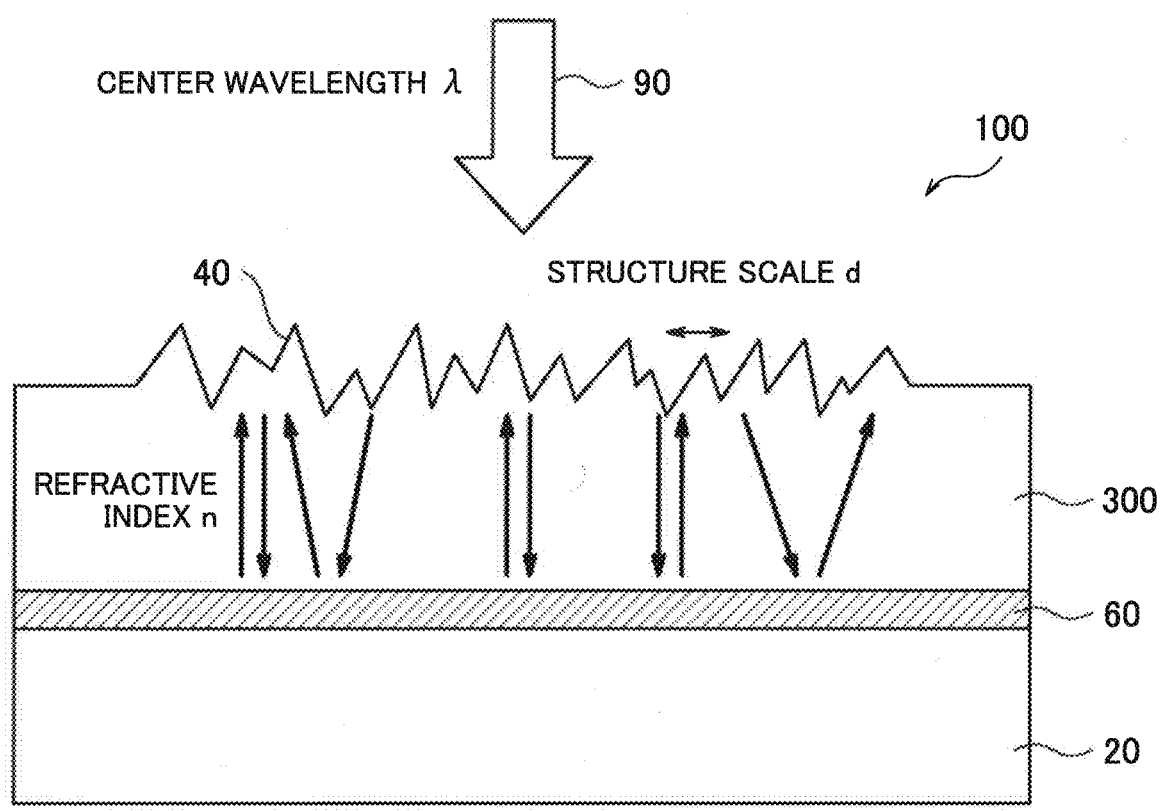
FIG. 6 is a sectional view schematically illustrating a thin film semiconductor optical sensor according to a second example embodiment of the present invention.

FIG. 6 is a sectional view illustrating an optical sensor according to a second example embodiment of the present invention.

An optical sensor 100 according to the example embodiment includes a light absorption medium 300 having a refractive index n and a thickness sufficiently less than a light transmission length. The light absorption medium 300 has a light incident surface texture structure 40. Assuming that an observation target center wavelength is $\lambda$, the texture structure has a random surface direction and a typical structure scale d defined as in $(\lambda/n)<d<\lambda$. Further, a light reflector 60 is arranged between the light absorption medium 300 and a substrate 20 in the example embodiment. The light reflector 60 desirably has a high reflectivity.

In the example embodiment, as in the first example embodiment, light incident having a target center wavelength $\lambda$ from the vertical directional vicinity (incident light 90) is less reflected at an incident surface by a moth eye effect. At a light incident surface (interface between the air and the light absorption medium 300), light incident from the air obtains a moth eye effect and light incident from the light absorption medium 300 (via rear surface reflection or the like) obtains an optical trap effect.

A moth eye effect is, as mentioned earlier, a graded index effect obtained by a microscopic structure and functions when light is incident from the air. Assuming that the light reflector 60 is flat, incident light substantially becomes light having an incident angle of 0° after a first reflection and is incident into a light incident surface. The light incident surface reflects light coming from inside the light absorption medium 300 and having a larger incident angle than a total reflection angle but transmits light having a smaller incident angle. The percentage of the incident angle of transmitted light is a small value of about 8% and 92% of the light has its propagating direction randomized and is totally reflected as long as a surface orientation is random, even when the light incident angle is constant, and returns into the light absorption medium 300. The light with its propagating direction randomized repeats reflections thereafter between a light incident surface and a rear surface. At the light incident surface, 8% of incident light leaks out of a device by a single reflection, and it is thus calculated that reflections occur about 20 times on the average. This obtains an about 20 times longer absorption length (an optical trap effect). While a trap efficiency is higher when a texture structure is arranged also in a rear surface as in the first example embodiment, that is, a longer absorption length is obtained, the example embodiment sufficiently obtains both an optical trap effect and a moth eye effect.

The optical sensor illustrated in FIG. 6 may be produced by using processes in FIG. 4 except (c) and (d).

The present invention has been described by using the above example embodiments as model examples. The present invention, however, is not limited to the aforementioned example embodiments. In other words, the present invention may apply various modes that will be understood by those skilled in the art within the scope of the present invention.

REFERENCE SIGNS LIST 1, 100 Optical sensor
2, 20 Substrate
3, 300 Light absorption medium
4, 40 Light incident surface texture structure
5 Rear surface texture structure
6, 60 Light reflector
7 Upper electrode
8 Lower electrode
9, 90 Incident light
10 Opening structure
31 Quantum dot absorption layer

The invention claimed is:

1. An optical sensor comprising a light absorption medium that has a refractive index n and a thickness sufficiently less than a light transmission length, wherein an observation target center wavelength is defined as $\lambda$, and the optical sensor further comprises: in a light incident surface, a texture structure having a random surface direction and a typical structure scale d defined as in $(\lambda/n)<d<\lambda$; and a light reflector on a surface on an opposite side of the light incident surface,
wherein the observation target center wavelength $\lambda$ and the typical structure scale d are defined as in $\lambda=(n+1)d/2$.

2. The optical sensor according to claim 1, wherein an electrode is arranged on the light incident surface of the light absorption medium and on the surface on the opposite side of the light incident surface, respectively.

3. The optical sensor according to claim 1, wherein the light absorption medium includes a semiconductor quantum dot.

4. An optical sensor comprising a light absorption medium that has a refractive index n and a thickness sufficiently less than a light transmission length, wherein an observation target center wavelength is defined as $\lambda$, and the optical sensor further comprises: in a light incident surface and a surface on an opposite side of the light incident surface, a texture structure having a random surface direction and a typical structure scale d defined as in $(\lambda/n)<d<\lambda$,
wherein the observation target center wavelength $\lambda$ and the typical structure scale d are defined as in $\lambda=(n+1)d/2$.

5. The optical sensor according to claim 4, further comprising a light reflector on the surface on the opposite side.

6. The optical sensor according to claim 4, wherein the light absorption medium is formed on a substrate, and the texture structure on the surface on the opposite side is formed on the substrate in a vicinity of the light absorption medium.

7. The optical sensor according to claim 4, wherein an electrode is arranged on the light incident surface of the light absorption medium and on the surface on the opposite side of the light incident surface, respectively.

8. The optical sensor according to claim 4, wherein the light absorption medium includes a semiconductor quantum dot.

9. A method of forming an optical sensor, the method comprising: forming, on a substrate, a light absorption medium having a refractive index n and a thickness sufficiently less than a light transmission length; forming, on the light absorption medium, an opening pattern having a random substrate surface direction; and then forming a first texture structure having a typical structure scale d defined as in $(\lambda/n)<d<\lambda$ on the light absorption medium; and after forming the first texture structure, removing the substrate from an opposite side of a surface including the first texture structure; exposing a rear surface of the light absorption medium; forming, in the rear surface, an opening pattern having a random substrate surface direction; and then forming a second texture structure.

* * * * *

UNITED STATES PATENT AND TRADEMARK OFFICE
CERTIFICATE OF CORRECTION

PATENT NO. : 10,879,407 B2
APPLICATION NO. : 16/336740
DATED : December 29, 2020
INVENTOR(S) : Yoshihiro Nambu Page 1 of 1

It is certified that error appears in the above-identified patent and that said Letters Patent is hereby corrected as shown below:

In the Specification

Column 10, Example of Embodiment, Line 57; Delete "(b)" and insert --((b)-- therefor Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*